(12) United States Patent
Lee et al.

(10) Patent No.: US 8,133,759 B2
(45) Date of Patent: Mar. 13, 2012

(54) LEADFRAME

(75) Inventors: Jui-Chung Lee, Tou-Liu (TW); Po-Hsin Lin, Chunan (TW); Kun-Feng Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/431,128

(22) Filed: Apr. 28, 2009

(65) Prior Publication Data

US 2010/0270665 A1 Oct. 28, 2010

(51) Int. Cl.
*H01L 21/00* (2006.01)

(52) U.S. Cl. ............... 438/106; 257/676; 257/E21.001; 257/E23.031; 257/677; 257/678; 438/107; 438/108; 438/123

(58) Field of Classification Search .......... 438/106–123, 438/612; 257/676, E21.001, E23.031, 677, 257/678, E21.499, E23.034, 666, 670, 672
See application file for complete search history.

(56) References Cited

U.S. PATENT DOCUMENTS

| | | | | |
|---|---|---|---|---|
| 4,380,114 A | * | 4/1983 | Webb | 438/109 |
| 5,150,193 A | | 9/1992 | Yasuhara et al. | |
| 5,656,550 A | * | 8/1997 | Tsuji et al. | 438/123 |
| 5,847,458 A | * | 12/1998 | Nakamura et al. | 257/738 |
| 5,892,290 A | * | 4/1999 | Chakravorty et al. | 257/786 |
| 6,025,650 A | * | 2/2000 | Tsuji et al. | 257/786 |
| 6,188,130 B1 | * | 2/2001 | Ramirez et al. | 257/706 |
| 6,204,553 B1 | * | 3/2001 | Liu et al. | 257/676 |
| 6,208,020 B1 | * | 3/2001 | Minamio et al. | 257/684 |
| 6,452,255 B1 | * | 9/2002 | Bayan et al. | 257/666 |
| 6,465,876 B1 | * | 10/2002 | Kitano et al. | 257/668 |
| 6,559,526 B2 | | 5/2003 | Lee et al. | |
| 6,611,063 B1 | * | 8/2003 | Ichinose et al. | 257/784 |
| 6,638,790 B2 | * | 10/2003 | Minamio et al. | 438/111 |
| 6,642,609 B1 | * | 11/2003 | Minamio et al. | 257/666 |
| 6,650,020 B2 | * | 11/2003 | Yamada et al. | 257/783 |
| 6,777,788 B1 | * | 8/2004 | Wan et al. | 257/670 |
| 6,989,294 B1 | * | 1/2006 | McLellan et al. | 438/111 |
| 7,026,192 B2 | * | 4/2006 | Minamio et al. | 438/123 |
| 7,132,315 B2 | * | 11/2006 | Minamio et al. | 438/123 |
| 7,145,222 B2 | * | 12/2006 | Gai | 257/667 |
| 7,183,134 B2 | * | 2/2007 | Lee et al. | 438/106 |
| 7,217,995 B2 | | 5/2007 | Tsai et al. | |
| 7,400,049 B2 | * | 7/2008 | Shim et al. | 257/796 |
| 7,446,397 B2 | * | 11/2008 | Gai | 257/667 |
| 7,462,925 B2 | | 12/2008 | Tsai et al. | |
| 7,495,327 B2 | | 2/2009 | Tsai et al. | |
| 7,579,676 B2 | * | 8/2009 | Lin | 257/676 |
| 7,608,484 B2 | * | 10/2009 | Lange et al. | 438/114 |
| 7,622,332 B2 | * | 11/2009 | Islam et al. | 438/123 |
| 7,638,863 B2 | * | 12/2009 | Celaya et al. | 257/678 |
| 7,728,414 B2 | * | 6/2010 | Omori et al. | 257/676 |
| 7,768,121 B2 | * | 8/2010 | Colgan et al. | 257/707 |
| 7,834,435 B2 | * | 11/2010 | Chen et al. | 257/676 |

(Continued)

*Primary Examiner* — N Drew Richards
*Assistant Examiner* — Ankush Singal
(74) *Attorney, Agent, or Firm* — Haynes Beffel & Wolfeld LLP

(57) ABSTRACT

A leadframe includes a die paddle and leads, in which the back side of the die paddle has a fillister. The fillister defines a rim surrounding a recess, and the recess accommodates protrusion of fusible material. Also, a package includes such a leadframe. Also, a method for making a leadframe includes patterning a sheet of metal to form a die paddle and leads, and forming a fillister in the back side of the die paddle.

30 Claims, 9 Drawing Sheets

U.S. PATENT DOCUMENTS

| | | | |
|---|---|---|---|
| 2002/0105069 A1* | 8/2002 | Kawahara et al. | 257/690 |
| 2002/0146863 A1* | 10/2002 | Lin et al. | 438/119 |
| 2002/0168796 A1* | 11/2002 | Shimanuki et al. | 438/106 |
| 2002/0180015 A1* | 12/2002 | Yamaguchi et al. | 257/678 |
| 2003/0001289 A1* | 1/2003 | Yamada et al. | 257/783 |
| 2003/0127711 A1* | 7/2003 | Kawai et al. | 257/666 |
| 2004/0056337 A1* | 3/2004 | Hasebe et al. | 257/667 |
| 2004/0166662 A1* | 8/2004 | Lei | 438/614 |
| 2004/0217450 A1* | 11/2004 | Li et al. | 257/666 |
| 2005/0006737 A1* | 1/2005 | Islam et al. | 257/676 |
| 2005/0104198 A1* | 5/2005 | Takahashi | 257/708 |
| 2005/0263864 A1* | 12/2005 | Islam et al. | 257/676 |
| 2006/0038266 A1* | 2/2006 | Song et al. | 257/676 |
| 2007/0059865 A1* | 3/2007 | Huang et al. | 438/123 |
| 2007/0215990 A1* | 9/2007 | San Antonio et al. | 257/666 |
| 2007/0259482 A1 | 11/2007 | Tsai et al. | |
| 2008/0029856 A1* | 2/2008 | Chou et al. | 257/666 |
| 2008/0258278 A1* | 10/2008 | Ramos et al. | 257/676 |
| 2008/0268578 A1* | 10/2008 | Shimanuki et al. | 438/124 |
| 2009/0032923 A1 | 2/2009 | Tsai et al. | |
| 2009/0166826 A1* | 7/2009 | Janducayan et al. | 257/676 |
| 2010/0038759 A1* | 2/2010 | Lam | 257/676 |

* cited by examiner

LEADFRAME

BACKGROUND

1. Field of the Invention

This invention relates to semiconductor package Surface Mount Technology ("SMT") and, particularly, to surface mount of packages having an exposed die paddle surface.

2. Description of Related Art

A conventional leadframe semiconductor die package has a semiconductor die mounted onto and electrically connected to a leadframe. The leadframe, which may be formed by patterning a sheet of electrically conductive metal such as copper, typically includes a die paddle, onto which the die is affixed, and leads, to which the die is electrically connected. The mounted die may be encapsulated or molded, and the leads may project from one or more sidewalls of the molding or encapsulation (a "leaded package"); or the leads may end at one or more of the sidewalls of the molding or encapsulation (a "leadless package" or "no-lead package").

An encapsulated leadless package is shaped generally as a thin rectangular parallelepiped having larger rectangular or square upper and lower sides. Typically, lower surfaces of the die paddle and leads are exposed at the lower (package mount) side of the package, and end surfaces of the leads are exposed at (and are generally flush with) one or more sidewalls of the package. Thus a typical leadless semiconductor die package appears on the package mount side as a thin rectangular or square solid block of the molding or encapsulation material, with die paddle surfaces exposed flush with the "underside" (lower or package mount side) of the package and leads exposed flush with the underside and with one or more of the sidewalls of the package adjacent the lower edges. A quad flat no lead ("QFN") package has leads exposed flush with the sidewalls adjacent all four lower edges, and a dual flat no lead ("DFN") package has leads exposed flush with the sidewalls adjacent two (typically opposite) lower edges.

Various approaches to mounting the die in the package, and electrically connecting the die to the leadframe, are in use. Generally the die may be connected by wire bonds or by flip-chip interconnection, for example.

In a conventional flip chip package, electrically conductive balls or bumps are affixed to the bond pads on the die, and the die is mounted "die-down", that is, the die is oriented so that the active side of the die faces toward the leadframe. The balls or bumps are aligned with bond sites on the die paddle to effect electrical connection of the die to the leadframe.

In a conventional wire-bonded leadframe package the die is mounted "die-up", that is, the die is oriented so that the active side of the die faces away from the leadframe. In such a package the die may be affixed to the die mount surface of the die paddle using a die attach adhesive, and the die is electrically connected to the leadframe by wires connecting interconnect pads on the die with bond sites on the leads (and, in some instances, with bond sites on the die paddle).

The functioning die can generate a significant amount of heat. In some configurations, particularly where the die paddle is exposed at the back side of the package, the die paddle may carry heat from the die away from the package to the underlying substrate. For example, the die may be affixed to the die paddle using a thermally conductive (and, optionally, electrically insulative) adhesive, so that heat is conducted from the back side of the die, through the adhesive, to the die paddle.

A flat no-lead package may be installed by surface mount onto a support such as a printed circuit board. Bond fingers are exposed at the package mount surface of the support to provide electrical connection of the package to circuitry in the support. In a conventional surface mount, the bond fingers are situated so that the exposed leads at the back side of the package can be aligned with corresponding bond fingers. An electrically conductive material, typically a solder paste, is applied onto the bond fingers on the support, and the package is mounted by placing the package in alignment onto the support and applying heat to reflow the solder and complete the connection. In package configurations having an exposed die paddle, the support may additionally have an exposed thermal pad situated in alignment with the die paddle; a solder paste may be provided at the thermal pad as well as at the bond fingers, to provide good thermal conduction from the package to the support. Typically thermally conductive vias carry heat from the thermal pad to the opposite side of the support, or to a thermally conductive layer (such as a ground plane) in the support.

The package is typically subjected to heat stress, for example by thermal cycling, and is then visually inspected and electrically tested before it is mounted on the support. Packages that fail visual inspection or electrical testing are discarded.

SUMMARY

The invention provides for surface-mountable packages having a die paddle exposed at the back side of the package, which are more likely to pass visual inspection following pre-mount heat cycling, and which are more likely to yield good and reliable electrical connection following mount on the printed circuit board or other support. This is accomplished according to one aspect of the invention by recessing the back side of the die paddle, and according to another aspect of the invention by providing a fillister on the exposed back side of the die paddle.

The leadframe is conventionally made by patterning a copper or copper alloy sheet. The lower surfaces of the die paddle and the leads typically are plated with a thin layer of a metal or metal alloy that provides for a robust solder connection. The plating on the exposed back sides of the leads and the die paddle melts during thermal cycling during the pre-mount testing phase. One source of failure in visual inspection is a consequence of the fact that, as the plating material melts, the melted mass tends by cohesion to form an irregular protruding shape. The cohering solder mass on the die paddle may protrude so much that it prevents the solder on one or more of the package leads from making good contact with the underlying bond fingers on the support. Or, the support may have unmasked circuit traces underlying the die paddle, and the protruding solder mass on the die paddle may contact these circuit traces and cause an electrical short. Even in cases where the protruding mass would not in fact interfere with good electrical contact or result in electrical shorting if the package were mounted, the package may nevertheless be rejected for failing visual inspection.

Generally, the invention features a leadframe in which at least part of the surface of the die paddle opposite the die mount side (the "back" side) is recessed in relation to the back side of the package. The leadframe may have an upset die paddle, and a mold flow dam ring may be employed to prevent incursion of the encapsulant over the back side of the die paddle; or, the back side of the die paddle may be etched back following encapsulation. Or the die paddle may be provided with a fillister in the back side, defining a rim and a recessed surface. The plating material covers the lower surfaces of the leads and the lower surfaces of the recessed die paddle. The volume of the space defined by the recess is sufficient to accommodate protrusions of the plating material in the recess, to mitigate contact of the plating material with the underlying support during surface mount on a support. Accordingly, vertical offset of the package can be reduced or eliminated, and unwanted contact of the fusible material beneath the die paddle with underlying circuitry in the support can be avoided.

In one general aspect the invention features a leadframe including a die paddle and leads, in the back side of the die paddle is recessed in relation to the back side of the package.

In some embodiments the leadframe further includes a plating material covering the lower surfaces of the leads and the recessed surface of the die paddle.

In some embodiments the recess defines a recess depth in a range about ⅓ to ½ the leadframe thickness. In some embodiments the depth is at least about as great as an expected height of a protrusion of plating material following pre-mount thermal cycling. In a particular example, where a protrusion is expected to reach a height about 75 um, the depth is about 75 um.

In another general aspect the invention features a leadframe including a die paddle and leads, in which the back side of the die paddle has a fillister. The fillister defines a rim surrounding a recess.

In some embodiments the leadframe further includes a plating material covering the lower surfaces of the leads, the lower and inner surfaces of the rim, and the surface of the recess.

In some embodiments the recess defines a recess depth in a range about ⅓ to ½ the leadframe thickness. In some embodiments the depth is at least about as great as an expected height of a protrusion of plating material following pre-mount thermal cycling. In a particular example, where a protrusion is expected to reach a height about 75 um, the depth is about 75 um.

In some embodiments the die paddle has at least two fillisters, and in some embodiments three or more fillisters, each defining a recess having a depth in a range about ⅓ to ½ the leadframe thickness.

In another general aspect the invention features a semiconductor package having an exposed die paddle, the die paddle having an exposed side that is recessed in relation to the back side of the package. In some embodiments the die paddle is upset; in other embodiments the die paddle is etched back. In some embodiments the die paddle has a fillister in the exposed side.

In some embodiments the package includes a die mounted on a leadframe, the leadframe comprising a die paddle having a fillister (or two or more fillisters) in the side opposite the die mount side (the "back" side). In various embodiments the fillister (or fillisters) may be configured as described above.

In another general aspect the invention features a method for making a leadframe by patterning a sheet of metal to form a die paddle and leads, and forming an offset in the back side of the die paddle. In some embodiments the offset is formed by etching back the die paddle; in other embodiments the offset is formed by displacing the die paddle in relation to the leads to form an upset die paddle. In some embodiments the offset in formed by forming a fillister in the back side of the die paddle. In some such embodiments the fillister is formed by partially etching an area of the back side of the die paddle; in other such embodiments the fillister is formed by deforming a portion of the back side of the die paddle.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, features corresponding to features shown in other drawings are not all particularly renumbered, although they are all readily identifiable in all the FIGs.

Figure 1A:
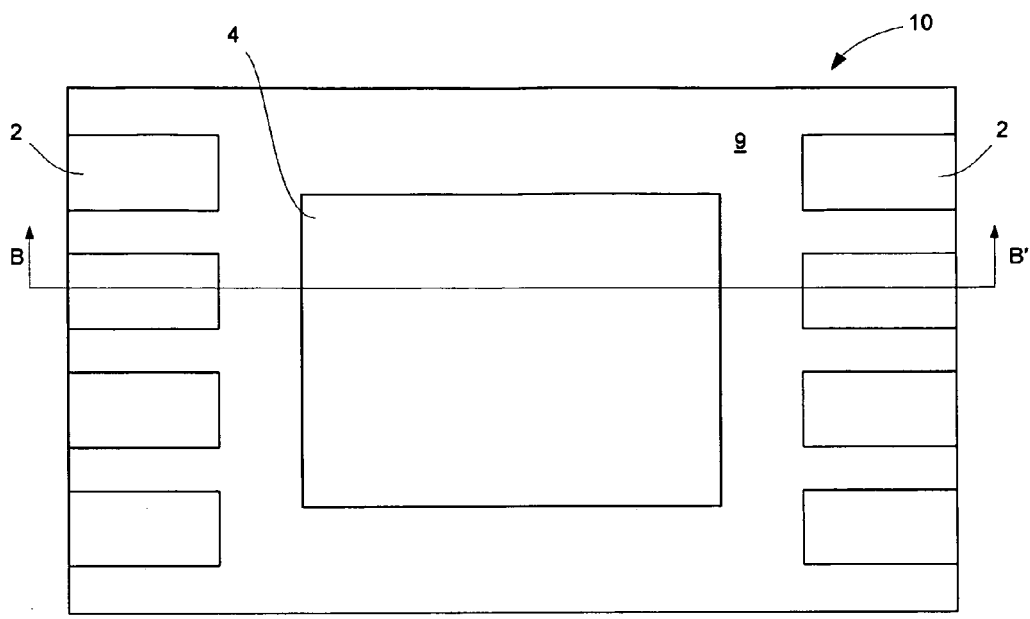
FIGS. 1A and 1B are diagrammatic sketches showing a conventional Dual Flat No-lead ("DFN") package in a plan view (FIG. 1A) and in a sectional view taken along the line B-B' (FIG. 1B).
Figure 1B:
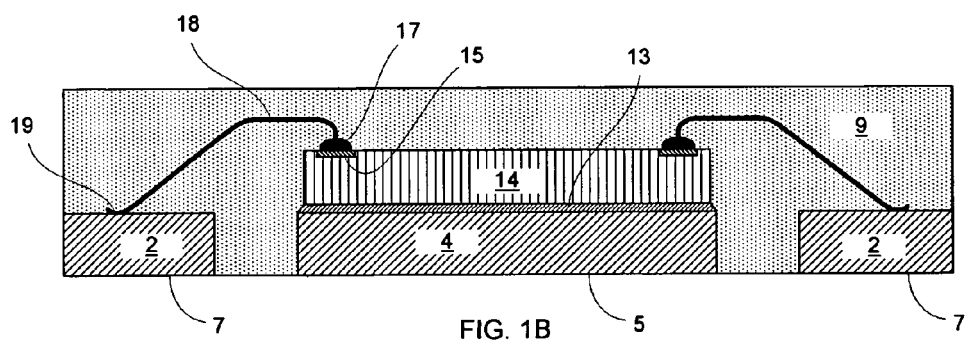
Figure 2A:
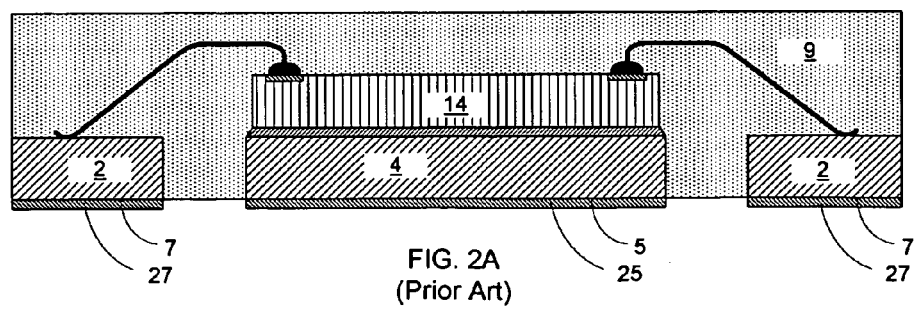
FIG. 2A is a diagrammatic sketch in a sectional view showing a conventional DFN package as in FIG. 1B, having a material plated on the leadframe.
Figure 2B:
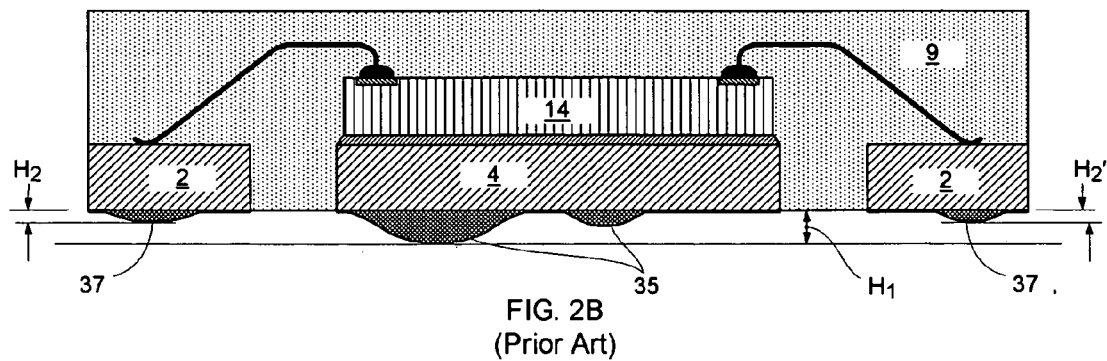
FIG. 2B is a diagrammatic sketch in a sectional view showing a package as in FIG. 2A, following pre-mount thermal cycling.
Figure 3A:
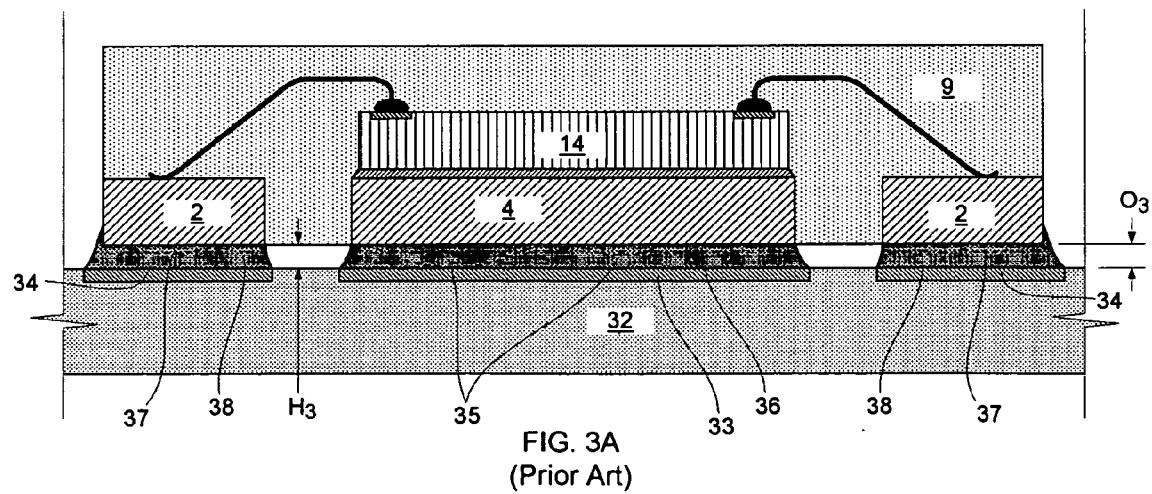
FIG. 3A is a diagrammatic sketch in a sectional view showing a conventional package as in FIG. 2B, mounted on a printed circuit board.
Figure 3B:
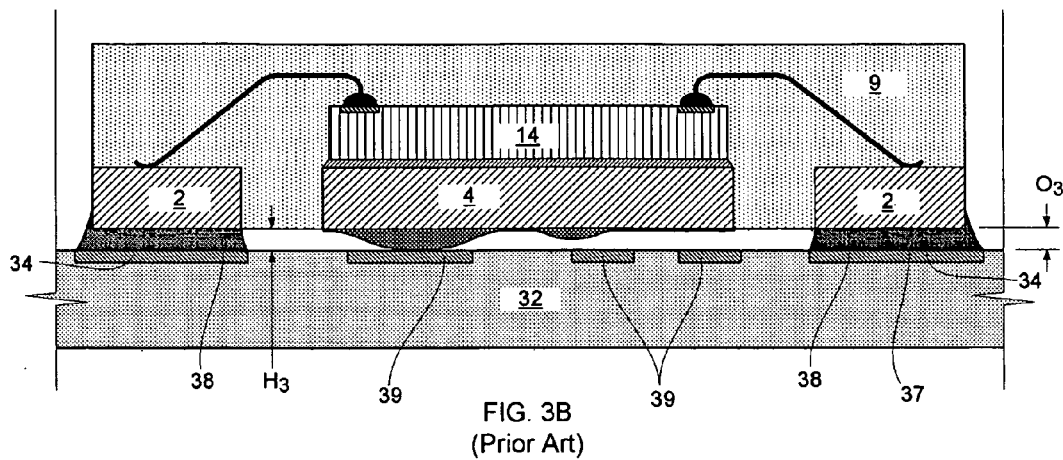
FIGS. 3B and 3C are diagrammatic sketches in a sectional view showing results of failed attempts to surface mount a conventional package as in FIG. 2B.
Figure 3C:
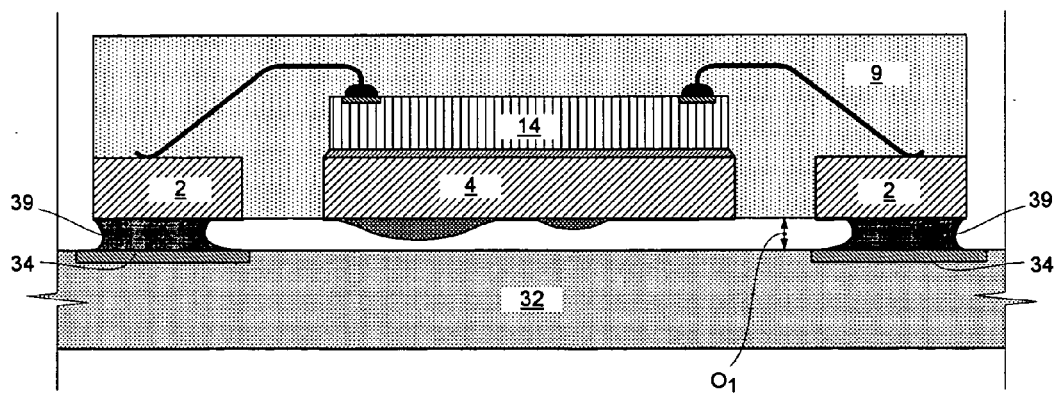

FIGS. 1A and 1B show a conventional DFN package; FIG. 2A shows the DFN package with plating, ready for testing; and FIG. 2B shows the package following thermal cycling, ready for surface mount. FIG. 3A shows a mounted package, and FIGS. 3B and 3C show two modes of failure that may result from an attempt to mount a conventional plated package onto a support such as a printed circuit board.

Referring now to FIG. 1A, there is shown generally at 10 a view of the package mount (lower) side of a conventional DFN package. The lower surface of the encapsulant 9 defines the general outline of the package. The lower surfaces of the die paddle 4 and of the leads, e.g. 2, are exposed at the lower side of the package. The leads are arrayed along two opposite lower edges of the package and, accordingly, this is a "dual" flat package; in a "quad" flat package the leads would be arrayed along all four lower edges of the package (other package types are known). Also, the leads do not project beyond the sidewalls of the encapsulant and, accordingly, this example is a "no-lead" or "leadless" package. The interior of the conventional DFN package of FIG. 1A appears in FIG. 1B in a sectional view along the line indicated at B-B' in FIG. 1A. A die 14 is affixed to the die attach side of the die paddle 4 by a die attach adhesive 13. The die attach adhesive may optionally be thermally conductive, so that heat generated by the die is readily conducted to the die paddle; also, the die attach adhesive may optionally be electrically insulative. Wire bonds, e.g. 18, electrically connect the die to the leadframe; in this example, the die is forward-bonded, that is, a wire bonding tool is used to form a ball bond 17 on the bond pad 15, then to draw the wire toward the bond site on the lead 2, and then to form a stitch bond 19 on a bond site on the lead. After all the wire bonds have been formed, the structure is sealed using an encapsulation 9, which covers the die, the wire bonds, and all the surfaces of the leadframe except the lower surface 5 of the die paddle 4 and the lower surfaces 7 of the leads 2. Typically the packages are built up in a strip or array, and the individual packages are punched or sawed from the strip or array. Because the leads traverse the saw or punch line, the ends of the leads are exposed at the sidewalls of the individual packages.

In a standard package, the exposed lower surfaces of the die paddle and the leads are plated as shown at 27 and 25 in FIG. 2A with a metal or metal alloy material such as, for example, Sn, Sn—Cu, Sn—Bi. A standard plating thickness is in the range about 300 to about 800 micro-inches (about 7.62 to about 20.32 um). The plating improves the solder joint between the leadframe and the bond fingers in the support.

As noted above, during pre-mount thermal cycling (for example using an IR oven to raise the temperature to about 260 C), the melted plating can by cohesion form irregular protrusions, and the resulting irregular surface may fail visual inspection (and could cause electrical failure or electrical short when mounted). At lower plating thicknesses within the standard range (about 7 to about 8 um, for example), following thermal cycling the protrusions may be absent or low and the surface may appear smooth enough to pass visual inspection. At higher plating thicknesses (greater than about 9 um, for example) thermal cycling can result in a rough-appearing (and visually unacceptable) surface.

This effect is illustrated in a sectional view for example in FIG. 2B. The plating material on the die paddle has formed protrusions 35, the highest of which has a height $H_1$. The plating material on the leads has formed protrusions 37, having heights $H_2$, $H_2'$. The protrusions on the die paddle are larger (and project higher) than on the leads because there is a greater mass of plating material on the die paddle. The package illustrated in FIG. 2B may fail visual inspection and, if mounted on a support, may produce electrical failure or shorting.

A package that survives testing and passes visual inspection is mounted on a support such as a printed circuit board by placing the package onto the support with the leads aligned with the corresponding bond fingers and heating the assembly to reflow the solder.

FIG. 3A illustrates a package as in FIG. 2B mounted on a support such as a printed circuit board 32. The support is provided at the package mount surface with bond fingers 34 and thermal pad 33. Typically the bond fingers would be connected to circuitry (not shown in the figures) on and in the support, and thermally conductive vias (not shown) would connect the thermal pad to the opposite side of the support or to a thermally conductive layer in the support such as a ground plane (not shown). The protrusions of plating material are shown here smaller than in FIG. 2B, and the solder connections of the leads to the bond fingers and of the die paddle to the thermal pad are shown here as successful (although possibly not as robust as may be desired). The greatest plating material protrusion on the die paddle has a height $H_3$ and, when the package is mounted as shown, the protrusion imposes a standoff distance $O_3$ between the back side of the package and the package mount surface of the support. The reflowed solder 36 connecting the die paddle 4 to the thermal pad 33, and the reflowed solder 38 connecting the leads 2 to the bond fingers 34 are well-formed. Because the gap $O_3$ is so great, however, the solder joints may have an unacceptably reduced lifetime in use.

As noted above, cohesion of the fusible material during reflow can yield unsatisfactory results in one or more of at least two ways, as illustrated in FIGS. 3B and 3C.

Referring now to FIG. 3B, a conventional package as shown in FIG. 2B is surface mounted by a reflow onto a support such as a printed circuit board 32. The support has bond fingers 34 beneath the corresponding overlying package leads 2 and circuit traces 39 beneath the die paddle 4. As in the example of FIG. 3A, the protruding plating material on the die paddle imposes a standoff distance $O_3$ between the back side of the package and the package mount surface of the support. As shown, the solder 38 has made acceptable connections between the leads 2 and the bond fingers 34, although as noted above the solder joints may not be as robust as desired. However, the downward-protruding plating material 35 on the die paddle has made unwanted contact with at least some of the traces 39 beneath the die paddle. This can result in electrical short and failure of the assembly.

Referring now to FIG. 3C, a conventional package as shown in FIG. 2B is surface mounted by a reflow onto a support such as a printed circuit board 32. As in FIG. 3B, the support 32 has bond fingers beneath the corresponding overlying package leads 2. In this example there are no exposed circuit traces in the support beneath the die paddle. Here, however, the protrusion beneath the die paddle 4 touches the surface of the support 32 and, because the downward-protruding plating material has greater a protrusion height, it imposing an offset distance $O_1$ between the back side of the package and the support surface. This prevents good electrical contact of the solder 39 between at least some of the leads 2 and the underlying bond fingers 34, resulting in electrical failure of the assembly.

Figure 4A:
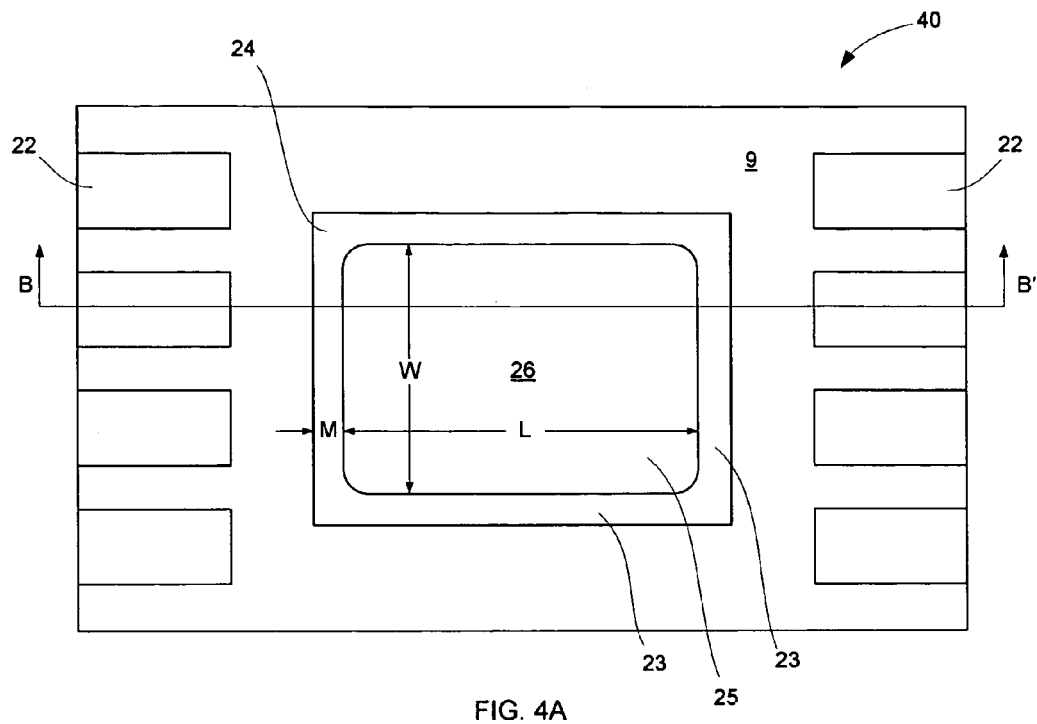
FIGS. 4A and 4B are diagrammatic sketches showing a DFN package according to an embodiment of the invention in a plan view (FIG. 4A) and in a sectional view taken along the line B-B' (FIG. 4B).

Turning now to FIG. 4A, there is shown generally at 40 a view of the package mount (lower) side of a DFN package according to an embodiment of the invention, in which a fillister in the die paddle provides a recessed die paddle surface. The lower surface of the encapsulant 9 defines the general outline of the package. The lower surfaces of the die paddle 24 and of the leads, e.g. 22, are exposed at the lower side of the package. A fillister at the lower side (the "back side") of the die paddle 24 defines a rim 23 and a recessed surface 25. The fillister has a width W and a length L, and the rim 23 has a width M.

Figure 4B:
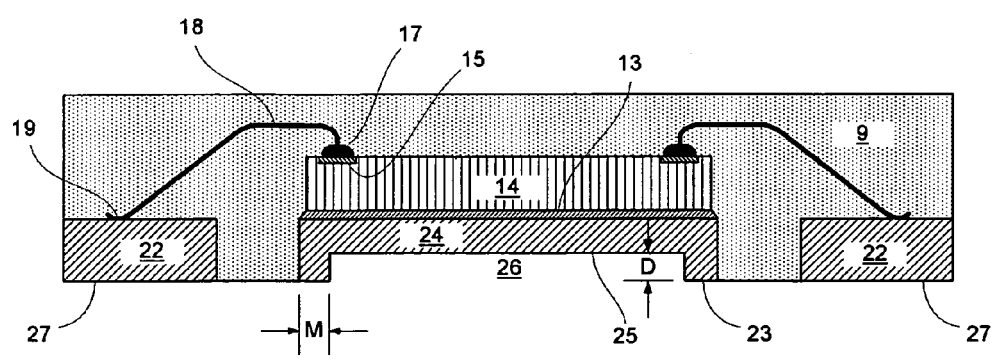

The interior of the DFN package of FIG. 4A appears in FIG. 4B in a sectional view along the line indicated at B-B' in FIG. 4A. A die 14 is affixed to the die attach side of the die paddle 24 by a die attach adhesive 13. Wire bonds, e.g. 18, connect the die to the leadframe; in this example, the die is forward-bonded, that is, a wire bonding tool is used to form a ball bond 17 on the bond pad 15, then to draw the wire toward the bond site on the lead 22, and then to form a stitch bond 19 on a bond site on the lead. After all the wire bonds have been formed, the structure is sealed using an encapsulation 9, which covers the die, the bond wires, and all the surfaces of the leadframe except the recessed surface 25 of the die paddle 24, the inner and lower surfaces of the rim 23, and the lower surfaces 27 of the leads 22. The fillister has a depth D, and the volume of the recess 26 is defined by the depth D, the width W, and the length L of the fillister. The rim 23 prevents incursion of the encapsulant into the recess 26 during the encapsulation process.

The fillister can be formed by, for example, a partial etch. For example, where the leadframe is made by patterning a copper or copper alloy sheet having a thickness about 150 um, the back side of the leadframe may be masked and substantially half etched to make a fillister having a depth about 75 um. This technique results in a flat surface on the non-etched top (die attach) surface of the die paddle, providing for good adhesion of the die at that surface. Typically the packages are built up in a strip or array, and the individual packages are punched or sawed from the strip or array. Because the leads traverse the saw or punch line, the ends of the leads are exposed at the sidewalls of the individual packages.

Figure 9:
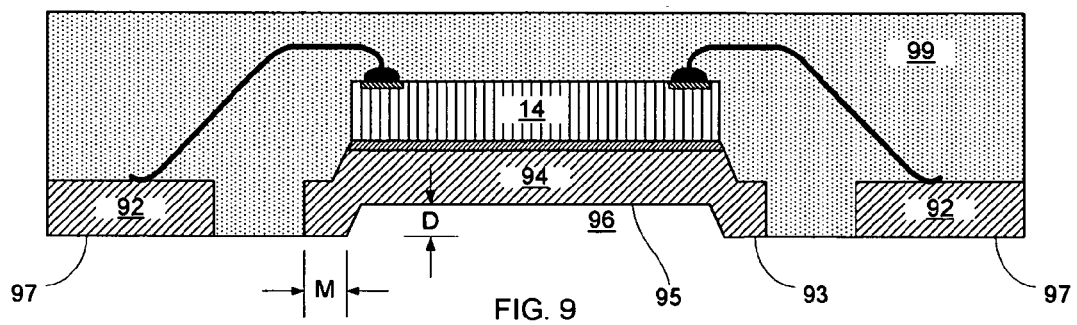
FIG. 9 is a diagrammatic sketch in a sectional view showing a package according to another embodiment of the invention.

The fillister may alternatively be formed by a "punch" process. In this technique the fillister is formed by using a press to deform the die paddle, so that a portion of the die paddle is offset to form the fillister. The punch process may be employed both to cut the sheet to form the die paddle and leads, and to deform the die paddle; or, the sheet may be patterned by an etch process, and a punch process may be employed to deform the die paddle. A package having a leadframe fillister made by a punch process is illustrated diagrammatically by way of example in FIG. 9. A die 14 is affixed to the die attach side of the deformed die paddle 94 by a die attach adhesive. Wire bonds connect the die to leads 92. The fillister defines a rim 93 and a recessed surface 95. The fillister has a depth D, and the volume of the recess 96 is defined approximately by the depth D and the length and width of the fillister. An encapsulation 99 covers the die, the wire bonds, and all the surfaces of the leadframe except the recessed surface 95 of the die paddle 94, the inner and lower surfaces of the rim, and the lower surfaces 97 of the leads 92. The rim 93 prevents incursion of the encapsulant into the recess 96 during the encapsulation process. The dimensions of the fillister made by the punch process may be similar to the dimensions of the fillister made by a partial etch.

Figure 5A:
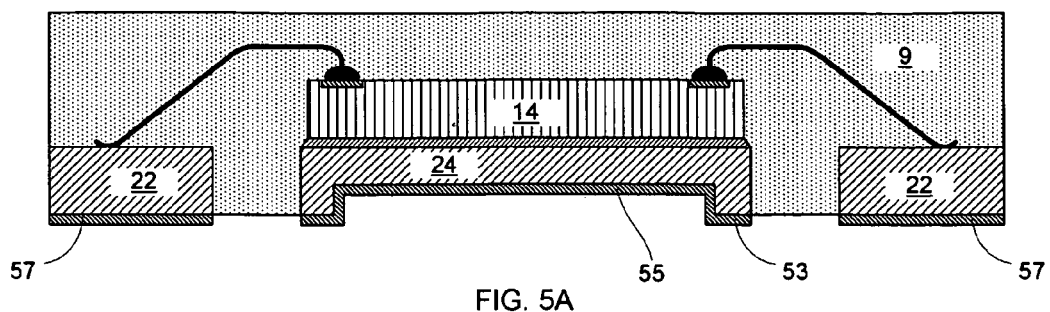
FIG. 5A is a diagrammatic sketch in a sectional view showing a DFN package according to an embodiment of the invention as in FIG. 4B, having a material plated on the leadframe.

Referring to FIG. 5A, the exposed lower surfaces of the leads and the die paddle are plated with a material such as Sn, Sn/Bi, Sn/Cu, for example; the leads are plated as shown at 57, and the lower surfaces of the die paddle 24 are plated, including the surfaces of the rim, as shown at 53 and the surface of the recess, as shown at 55. The plating thickness may conform with industry standards for the package type; for flat leadless packages, for example, the standard plating thickness is in a range about 9 um to about 20 um.

The plated package is then subjected to a pre-mount heat test, for example by thermal cycling (for example using an IR oven to raise the temperature to about 260 C). As explained above, this results in melting the plating, and the melted plating material can by cohesion form irregular protrusions. Because the protrusions on the surface of the recess are accommodated within the fillister, and do not extend significantly below the rim of the recess, they are not visible when the package is viewed edge-on. As a result, the package is less likely to fail visual inspection. Moreover, because the protrusions do not extend significantly below the back side of the package, the protrusions cannot interfere with any underlying features when the package is surface mounted on the support. Accordingly, successful electrical connection of the leads to the bond fingers, without shorting to any circuitry that may be exposed on the support beneath the die paddle, is more likely to result. This result is illustrated in a sectional view for example in FIG. 5B. The plating material on the surface of the fillister recess has formed protrusions 65, the largest of which has a height $H_3$. The plating material on the leads has formed smaller protrusions 67, having heights $H_2$, $H_2'$, and much smaller protrusions 63 on the rim of the fillister. The protrusions on the recess surface are larger (and project higher) than on the leads (or on the rim) because there is a greater mass of plating material on the die paddle. Because the depth D of the recess is about the same as the height $H_3$ of the largest protrusion on the recess surface, the protrusions on the recess surface do not project below the back side of the package, and they are not visible in an edge-on view.

Figure 5B:
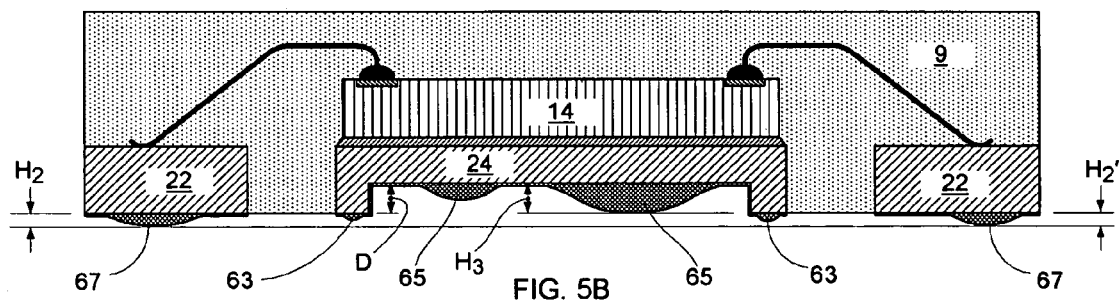
FIG. 5B is a diagrammatic sketch in a sectional view showing a package as in FIG. 5A, following pre-mount thermal cycling.
Figure 6A:
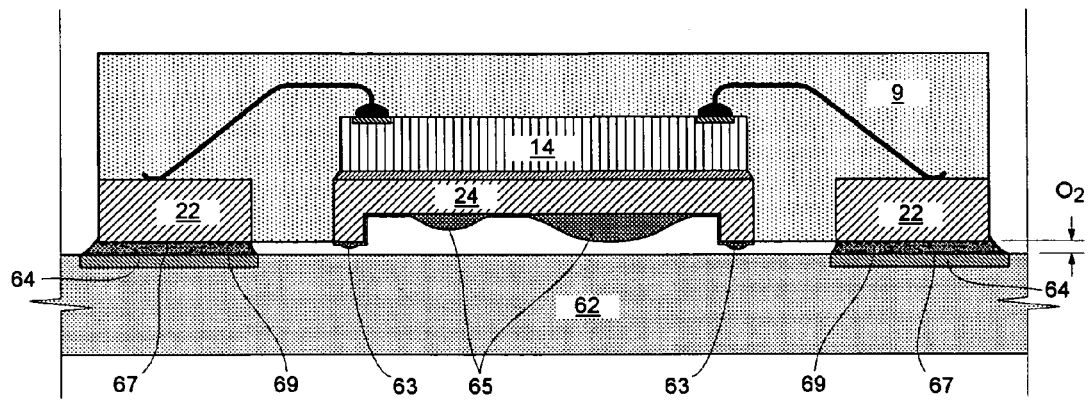
FIG. 6A is a diagrammatic sketch in sectional view showing a successful surface mount of a DFN package according to an embodiment of the invention as in FIG. 5B.

The package is then aligned with a support and a reflow process is used to reflow solder paste on bond fingers on the support to form electrical connections between the package leads and the bond fingers. Referring now to FIG. 6A, a pre-tested package as shown in FIG. 5B is surface mounted by reflow onto a support such as a printed circuit board 62. The support 62 has bond fingers 64 beneath the corresponding overlying package leads 22, but the support does not have exposed circuit traces beneath the die paddle. In the example shown here, the reflowed solder 63 on the fillister rim does not contact the surface of the support 62. The protruding plating material 65 is accommodated by the recess and does not contact the surface of the support 62. Accordingly (compare FIG. 3C), there is a smaller offset $O_2$ between the back side of the package and the support surface, and good electrical contact is made by the solder between the leads and the bond fingers.

Figure 6B:
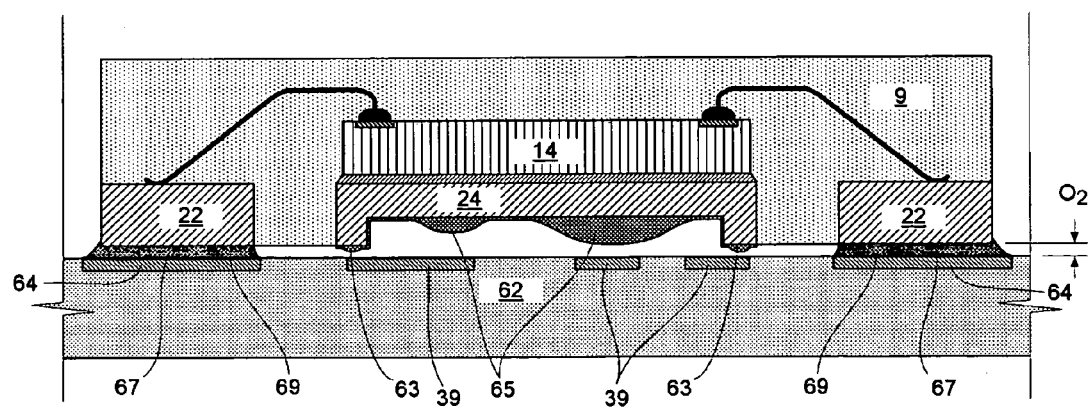
FIG. 6B is a diagrammatic sketch in sectional view showing a successful surface mount of a DFN package according to an embodiment of the invention as in FIG. 5B.

Referring now to FIG. 6B, a pre-tested package as shown in FIG. 5B is surface mounted by reflow onto a support such as a printed circuit board 62. In this example the support 62 has bond fingers 64 beneath the corresponding overlying package leads 22, and has circuit traces 39 beneath the die paddle 64. As in the example shown in FIG. 6A, the reflowed solder 63 on the fillister rim does not contact the surface of the support 62, and the protruding plating material 65 is accommodated by the recess and does not make unwanted contact with the traces 39 at the surface of the support 62 beneath the die paddle. Accordingly, there is a smaller offset $O_2$ between the back side of the package and the support surface, and good electrical contact is made by the solder between the leads and the bond fingers and, moreover, (compare FIG. 3B) electrical short between the die paddle and underlying circuitry is avoided.

Figure 7:
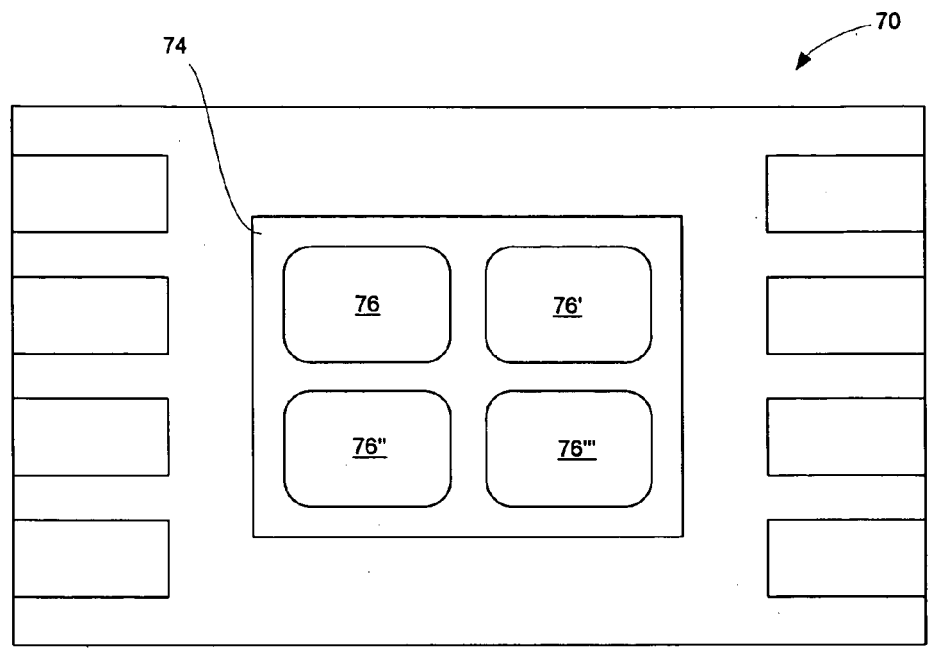
FIGS. 7 and 8 are diagrammatic sketches each in a plan view showing examples of alternative embodiments of the invention.
Figure 8:
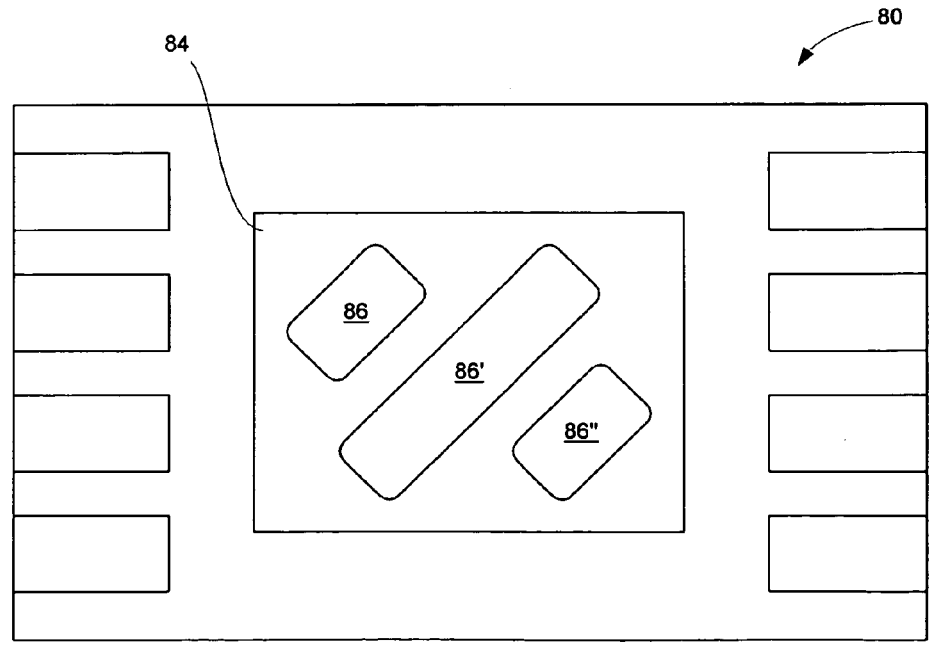

The back side of the die paddle may be provided with more than one fillister, and the fillisters may have any of a variety of shapes and arrangements, as shown for example in FIGS. 7 and 8. FIG. 7 shows the back side of a package 70 in which the leadframe die paddle 74 has four fillisters 76, 76', 76", 76'"; and FIG. 8 shows the back side of a package 80 in which the leadframe die paddle 84 has three fillisters 86, 86', 86".

Figure 10A:
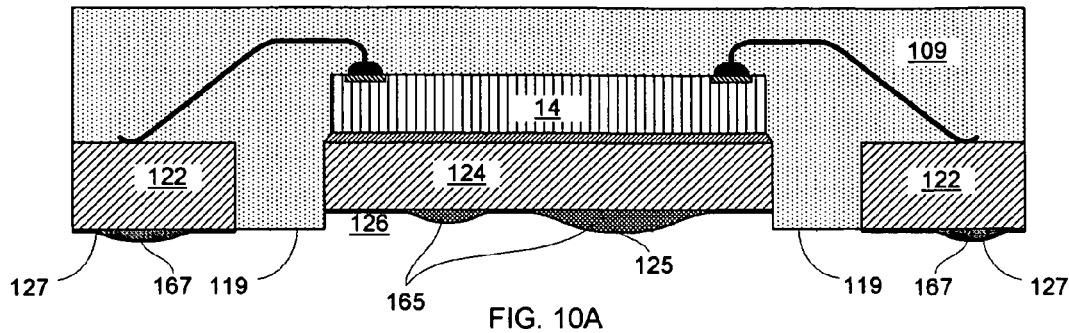
FIGS. 10A, 10B, and 10C are diagrammatic sketches in sectional view showing examples of alternative embodiments of the invention.
Figure 10B:
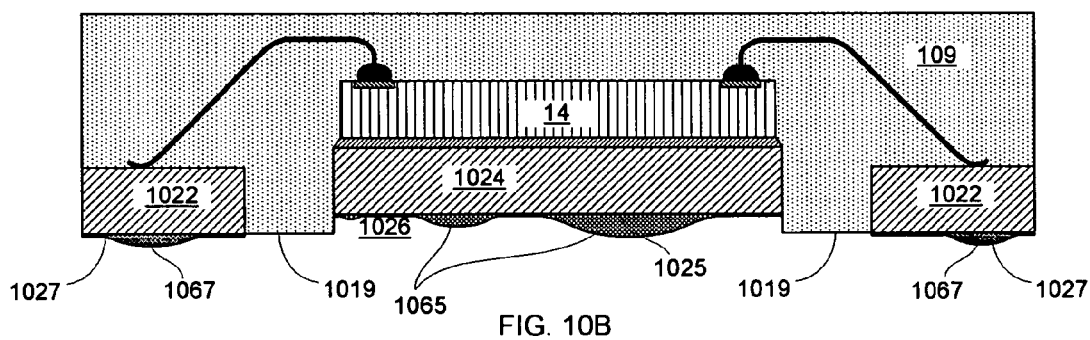
Figure 10C:
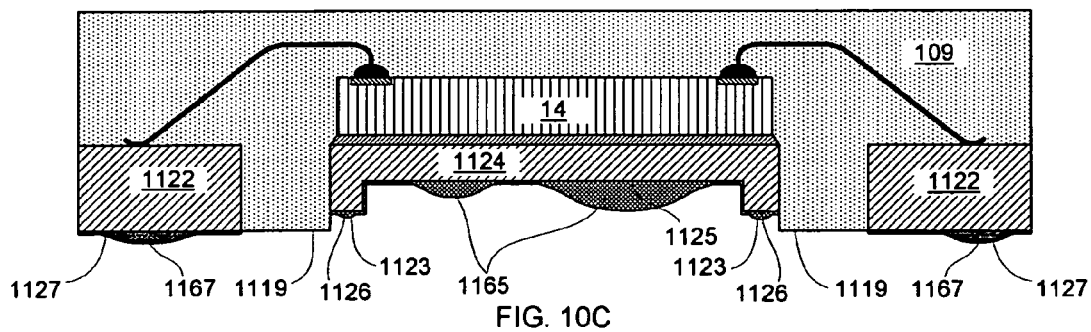

FIGS. 10A, 10B and 10C show the interior of a various package configurations in a sectional view (similar to the view shown in FIG. 4B), in which the die paddle is recessed in relation to the back side of the package. The lower surface of an encapsulant 109 defines the general outline of the package. The lower surfaces of the leads, e.g. 122, are exposed at the lower side of the package. In FIGS. 10A and 10B, the die paddle is not provided with a fillister. In FIG. 10A, the die paddle has been etched back to provide the recess; in FIG. 10B the die paddle is upset. In FIG. 10C the die paddle is provided with a fillister as in embodiments as described above, but here the fillister rim is recessed in relation to the back side of the package.

Referring now to FIG. 10A, a die 14 is affixed to the die attach side of the die paddle 124 by a die attach adhesive, and wire bonds connect bond pads on the die to bond sites on the leads 122. After all the wire bonds have been formed, the structure is sealed using an encapsulation 109, which covers the die, the bond wires, and all the surfaces of the leadframe except the (lower) side of the die paddle and leads. Then the lower surfaces 127 of the leads are masked and the exposed die paddle is etched back, thinning the die paddle. The back surface 119 of the encapsulation 109 remains substantially as before the etch, so the etch results in a recess 126 defined by the resulting surface 125 of the die paddle 124. The depth of the recess 126 from the encapsulant surface 119 to the die paddle surface 125 is determined by the depth of the etch, and the volume of the recess 126 is defined by the depth of the etch and the width and length of the void in the encapsulant left by etching back the die paddle. A plating material 165, 167 on exposed back surfaces is shown as it may appear following thermal cycling.

FIG. 10B shows a package having an upset die paddle, with a lower recessed surface not covered by the encapsulant. That is, after the metal sheet has been patterned to form the die paddle and leads, the die paddle 1024 is displaced (typically using a press) so that the back side 1025 of the die paddle 1024 lies in a different plane than the back side 1027 of the leads 1022. (As is well known, tie bars connecting the die paddle and leads are stretched to some extent during the upset displacement of the die paddle.) After the die paddle has been upset, a die 14 is affixed to the die attach side of the die paddle 1024 using a die attach adhesive, and the die is electrically connected to the leads 1022. After all the wire bonds have been formed, a mold flow dam is deployed at the periphery of the back side of the die paddle to prevent incursion of the encapsulant onto the recessed surface of the die paddle during the subsequent encapsulation procedure. As a result, the back surface 1019 of the encapsulant 109 is generally in the same plane as the back surfaces 1027 of the leads 1022, and the encapsulation procedure results in a recess 1026 defined by the surface 1025 of the displaced die paddle 1124. The depth of the recess 1026 from the encapsulant surface 1019 to the die paddle surface 1025 is determined by the extent of the upset displacement, and the volume of the recess 1026 is defined by the depth of the recess and the area of the void resulting from exclusion of the encapsulant by the mold dam. A plating material 1065, 1067 on exposed back surfaces is shown as it may appear following thermal cycling.

FIG. 10C shows an embodiment in which the back side of the die paddle 1124 is recessed (for example by an etch, as shown in this example) with respect to the back side of the package and in which a further recess in the die paddle is provided by a fillister. A die 14 is affixed to the die attach side of the die paddle 1124 by a die attach adhesive, and wire bonds connect bond pads on the die to bond sites on the leads 1122. After all the wire bonds have been formed, the structure is sealed using an encapsulation 109, which covers the die, the bond wires, and all the surfaces of the leadframe except the (lower) side of the die paddle and leads. Then the lower surfaces 1127 of the leads are masked and the exposed die paddle is etched back, thinning the die paddle. The die paddle is further etched to form a fillister at the already recessed lower surface of the die paddle. The back surface 1119 of the encapsulation 109 remains substantially as before the etch. The fillister defines a recessed rim 1123 and a further recessed surface 1125. The etch to form the fillister may be carried out at least in part prior to the etch back to recess the rim 1126.

A plating material 1123, 1165, 1167 on exposed back surfaces is shown as it may appear following thermal cycling.

Other embodiments are within the claims. For example, any package type having a die paddle with an exposed surface at the back side of the package may be provided with a recessed die paddle or with a fillister on the die paddle according to the invention, including for example so-called leadless packages having leads exposed on 1, or 3 edges as well as on two or four edges; and leaded packages.

We claim:

1. A leadframe, comprising a die paddle and leads, the die paddle having a die attach side and a back side, wherein the back side of the die paddle includes a fillister defining a rim surrounding a recess, wherein the recess defines a depth D, wherein D is at least about as great as an expected height of a protrusion of a plating material following pre-mount heat testing.

2. The leadframe of claim 1, further comprising a plating material on the back side of the die paddle.

3. The leadframe of claim 1 wherein D is at least about ⅓ the thickness of the leadframe.

4. The leadframe of claim 1 wherein D is in a range about ⅓ to about ½ the thickness of the leadframe.

5. The leadframe of claim 1 wherein a protrusion is expected to reach a height about 75 um, and D is about 75 um.

6. The leadframe of claim 1, comprising a plurality of fillisters each defining a rim surrounding a recess.

7. The leadframe of claim 1 wherein the die attach side of the die paddle is flat, and the die paddle is thinner at the recess than at the rim.

8. The leadframe of claim 1 wherein a fillister portion of the die paddle is offset.

9. The leadframe of claim 2 wherein the plating material comprises one of Sn, Sn—Bi, Sn—Cu.

10. The leadframe of claim 2 wherein the plating material has a thickness in a range about 7 um to about 20 um.

11. The leadframe of claim 10 wherein the plating material has a thickness in a range about 9 um to about 20 um.

12. The leadframe of claim 10 wherein the plating material has a thickness in a range about 13 um to about 20 um.

13. The leadframe of claim 10 wherein the plating material has a thickness in a range about 17 um to about 20 um.

14. A semiconductor package, comprising a leadframe, the leadframe comprising a die paddle and leads, the die paddle having a die attach side and a back side, wherein the back side of the die paddle includes a fillister defining a rim surrounding a recess, wherein the recess defines a depth D, wherein D is at least about as great as an expected height of a protrusion of a plating material following pre-mount heat testing.

15. The package of claim 14, further comprising a plating material on the back side of the die paddle.

16. The package of claim 14 wherein D is at least about ⅓ the thickness of the leadframe.

17. The package of claim 14 wherein D is in a range about ⅓ to about ½ the thickness of the leadframe.

18. The package of claim 14 wherein a protrusion is expected to reach a height about 75 um, and D is about 75 um.

19. The package of claim 14, comprising a plurality of fillisters each defining a rim surrounding a recess.

20. The package of claim 15 wherein the plating material comprises one of Sn, Sn—Bi, Sn—Cu.

21. The package of claim 15 wherein the plating material has a thickness in a range about 7 um to about 20 um.

22. The package of claim 21 wherein the plating material has a thickness in a range about 9 um to about 20 um.

23. The package of claim 21 wherein the plating material has a thickness in a range about 13 um to about 20 um.

24. The package of claim 21 wherein the plating material has a thickness in a range about 17 um to about 20 um.

25. A method for making a leadframe comprising patterning a sheet of metal to form a die paddle and leads, and forming a fillister in the back side of the die paddle, the fillister defining a rim surrounding a recess, wherein the recess defines a depth D, wherein D is at least about as great as an expected height of a protrusion of a plating material following pre-mount heat testing.

26. The method of claim 25 wherein forming the fillister comprises partially etching an area of the back side of the die paddle.

27. The method of claim 25 wherein patterning the sheet of metal comprises etching, and wherein forming the fillister comprises partially etching an area of the back side of the die paddle.

28. The method of claim 25 wherein patterning the sheet of metal comprises punching, and wherein forming the fillister comprises partially etching an area of the back side of the die paddle.

29. The method of claim 25 wherein patterning the sheet of metal comprises punching, and forming the fillister comprises deforming a portion of the die paddle.

30. A method for making a semiconductor leadframe package, comprising: patterning a sheet of metal to form a die paddle and leads; displacing the die paddle to form an upset die paddle; mounting a die on a die attach side of the die paddle and electrically connecting the die to leads to form an assembly; deploying a peripheral mold flow dam at a surface of the die paddle opposite the die attach side; and encapsulating the assembly, whereby the mold flow dam excludes encapsulant from a recess area of the die paddle, resulting in a recess at the area.

* * * * *